March 9, 1965 N. ÖIÅS 3,173,099
TRANSISTOR AMPLIFIER WITH AUTOMATIC GAIN CONTROL
Filed April 14, 1960
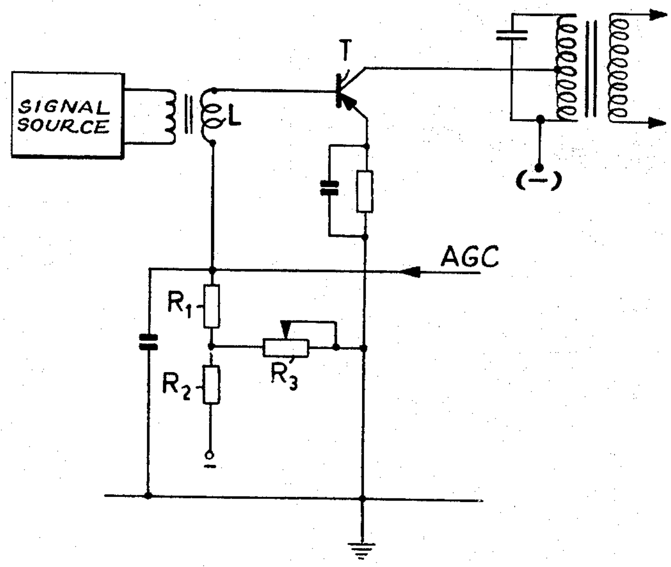
INVENTOR
NIDMUND ÖIÅS
BY Frank R. Trifari
AGENT United States Patent Office 3,173,099

Patented Mar. 9, 1965

3,173,099
TRANSISTOR AMPLIFIER WITH AUTOMATIC GAIN CONTROL

Nidmund Öiås, Norrkoping, Sweden, assignor to North American Philips Company, Inc., New York, N.Y., a corporation of Delaware Filed Apr. 14, 1960, Ser. No. 22,239
Claims priority, application Sweden, Apr. 17, 1959, 3,724/59
3 Claims. (Cl. 330—29)

The present invention relates to a transistor amplifier with automatic gain control, in which the gain control current traverses an impedance, and the voltage variations across the impedance are fed to the base of a transistor forming part of the amplifier.

When weak signals are amplified a distortionless output voltage is obtained without difficulty, which by means of a volume control can be adjusted to the desired level. When the signal strength is increased there is to some extent a down regulation of the amplifier by means of the automatic gain control and a subsequent adjustment can be made by means of the volume control. The regulation range of the automatic gain control is, however, greatly limited in transistor amplifiers and distortion appears quickly at increasing signal strength. A reduction of the level of the output voltage can be effected by means of the volume control, but the distortion of course remains. This is obviously a considerable disadvantage especially for portable receivers, which cannot advantageously be provided with too complicated regulation means for avoiding these difficulties.

The object of the present invention is to effect in a simple manner a volume regulation in amplifiers of the mentioned kind, by which distortion is avoided at amplification of strong signals. In the amplifier according to the invention this is effected by the fact that the impedance, which is traversed by the automatic gain control current, is connected to a point with adjustable potential. A reduction of the level of the output voltage on amplification of strong signals is thus effected by elevating the potential of the mentioned point, which causes a down regulation of the transistor and prevents distortion from arising.

The invention is more closely explained by reference to the enclosed drawing, which schematically shows as an example an embodiment of an amplifier according to the invention.

The drawing shows a part of the first intermediate-frequency amplifier stage of a radio receiver of transistor type. The intermediate-frequency signal is applied via a secondary winding L to the base of a transistor. The winding L is connected to a negative potential by way of two resistors $R_1$ and $R_2$ providing a bias voltage between base and emitter of transistor T in the forward direction. The junction between the resistors $R_1$ and $R_2$ is connected to ground potential by way of a variable resistor $R_3$. The current intended for automatic gain control is applied in a usual way to the junction between the coil L and the resistor $R_1$. When receiving strong signals, for instance when using receivers near to a powerful transmitter, the gain control current is great and the potential drop across the resistors $R_1$ and $R_2$ is great, which implies a down regulation of the transistor T. This regulation alone should not be sufficient to prevent distortion, but by an adjustment of the volume control caused by the strong output signal, that is the resistor $R_3$, a further down regulation of the transistor T occurs, through which distortion is prevented from appearing. When moving the movable contact of the resistance $R_3$ to the left in the figure the current through the resistors $R_3$ and $R_2$ increases and the base voltage of the transistor increases. When short-circuiting the resistor $R_3$ the base of the transistor will, at a suitable dimensioning, be positive in relation to its emitter and the transistor will be entirely blocked.

What is claimed is:

1. A transistor amplifier comprising a transistor having an input, an output and a common electrode, a source of input signals, first and second impedance means, a source of bias voltage having first and second terminals, means serially connecting said source of input signals and said first and second impedances, in that order, between said input electrode and said first terminal, means connecting said common electrode to said second terminal, variable resistor means connected between the junction of said first and second impedances and said second terminal, a source of gain control current, means connecting said source of control current between said second terminal and the junction of said first impedance and source of input signals, and output circuit means connected to said output electrode.

2. A transistor amplifier comprising a transistor having base, emitter and collector electrodes, a source of signals, a source of bias voltage having first and second terminals, first and second resistors, means serially connecting said source of signals and said first and second resistors, in that order, between said base electrode and said first terminal, means connecting said emitter electrode to said second terminal, a source of gain control current, means for connecting said source of gain control current between said second terminal and the junction of said first resistor and source of signals, means for varying the potential at the junction of said first and second resistor and output circuit means connected to said collector electrode.

3. A transistor amplifier comprising a transistor having base, emitter and collector electrodes, a source of signals, a source of bias voltage having first and second terminals, first and second resistors, means serially connecting said source of signals and said first and second resistors, in that order, between said base electrode and said first terminal, means connecting said emitter electrode to said second terminal, a source of gain control current, means for connecting said source of gain control current between said second terminal and one junction of said first resistor and source of signals, variable resistance means, means connecting said variable resistance means between the junction of said first and second resistors and said second terminal, and output circuit means connected to said collector electrode.

References Cited in the file of this patent

UNITED STATES PATENTS

| | | |
|---|---|---|
| 2,831,928 | Leyton | Apr. 22, 1958 |
| 2,866,015 | Sailor | Dec. 23, 1958 |
| 2,939,950 | Holmes | June 7, 1960 |

FOREIGN PATENTS

| | | |
|---|---|---|
| 181,630 | Austria | Apr. 12, 1955 |